United States Patent [19]

Purdy

[11] Patent Number: 5,180,981
[45] Date of Patent: Jan. 19, 1993

[54] METHOD FOR 3-D MAGNETIC RESONANCE IMAGING

[75] Inventor: David E. Purdy, East Winsor, N.J.

[73] Assignee: Siemens Medical Systems, Inc., Iselin, N.J.

[21] Appl. No.: 616,522

[22] Filed: Nov. 21, 1990

[51] Int. Cl.$^5$ ............................................ G01R 33/20
[52] U.S. Cl. ................................................ 324/309
[58] Field of Search .............. 324/300, 307, 309, 310, 324/311, 312, 313, 314, 318; 128/653.2, 653.5

[56] References Cited

U.S. PATENT DOCUMENTS

| | | | |
|---|---|---|---|
| 4,740,748 | 4/1988 | Rzedzian | 324/309 |
| 4,818,942 | 4/1989 | Rzedzian | 324/312 |
| 4,940,941 | 7/1990 | Rzedzian | 324/312 |

*Primary Examiner*—Michael J. Tokar
*Attorney, Agent, or Firm*—Lawrence C. Edelman

[57] ABSTRACT

A method for removing unwanted signal components acquired by applying a three dimensional magnetic resonance imaging pulse sequence to a sample, wherein signal acquisition is desired from a selected planar slice, but unwanted signal components are also acquired from a plurality of planar slices located outside the boundaries of the selected slice. According to the method, both a radio frequency saturation pre-pulse and a linear field gradient are applied to the sample. The pre-pulse and field gradient create a comb-like pattern of planar nuclear magnetic saturation regions in the sample, each of the regions being spatially positioned between a respective pair of contiguous planer slices. Next, a 3-D imaging sequence is applied to the sample. The timing of the 3-D imaging sequence is such that the comb-like saturation pattern of the pre-pulse sequence is imposed upon the 3-D imaging sequence so as to reduce the acquisition of signal originating from the regions when acquiring signal from the selected slice.

5 Claims, 4 Drawing Sheets

METHOD FOR 3-D MAGNETIC RESONANCE IMAGING

BACKGROUND OF THE INVENTION

1. Field of the Invention

The present invention relates to a method and apparatus for obtaining MR spectra, and in particular, to the acquisition and reconstruction of high resolution three-dimensional images with a nuclear magnetic resonance (MR) imager.

2. Description of the Prior Art

Current-three dimensional MR imaging techniques permit the acquisition of stacks of contiguous slices (portions) from a sample. For example, a stack of 64, 2 millimeter thick slices may be acquired. This stack is thus 128 millimeters thick. Unfortunately, with the present techniques, each slice contains unwanted information from every other slice.

The present invention is directed to substantially reducing the appearance of unwanted information from adjacent slices in a 3-D imaging system from appearing in a selected slice.

SUMMARY OF THE INVENTION

In this invention, means are provided for causing the signal from the regions near the interface of each pair of slices to be destroyed or substantially reduced by the application of a radiofrequency pulse that excites the sample in a spatially periodic manner. This reduces (in a given selected slice) the unwanted information from other slice positions.

Additionally, at the same time, the thickness of the desired slice is reduced. Thus with the present invention, for example, a stack of 64, 1 millimeter thick slices may be acquired such that the stack is still 128 millimeters thick.

Other features and advantages of the invention will be apparent from the description of the preferred embodiment of the invention and from the claims.

For a fuller understanding of the present invention, reference should now be made to the following detailed description of the preferred embodiment of the invention and to the accompanying drawings.

DESCRIPTION OF THE PREFERRED EMBODIMENTS

Figure 1:
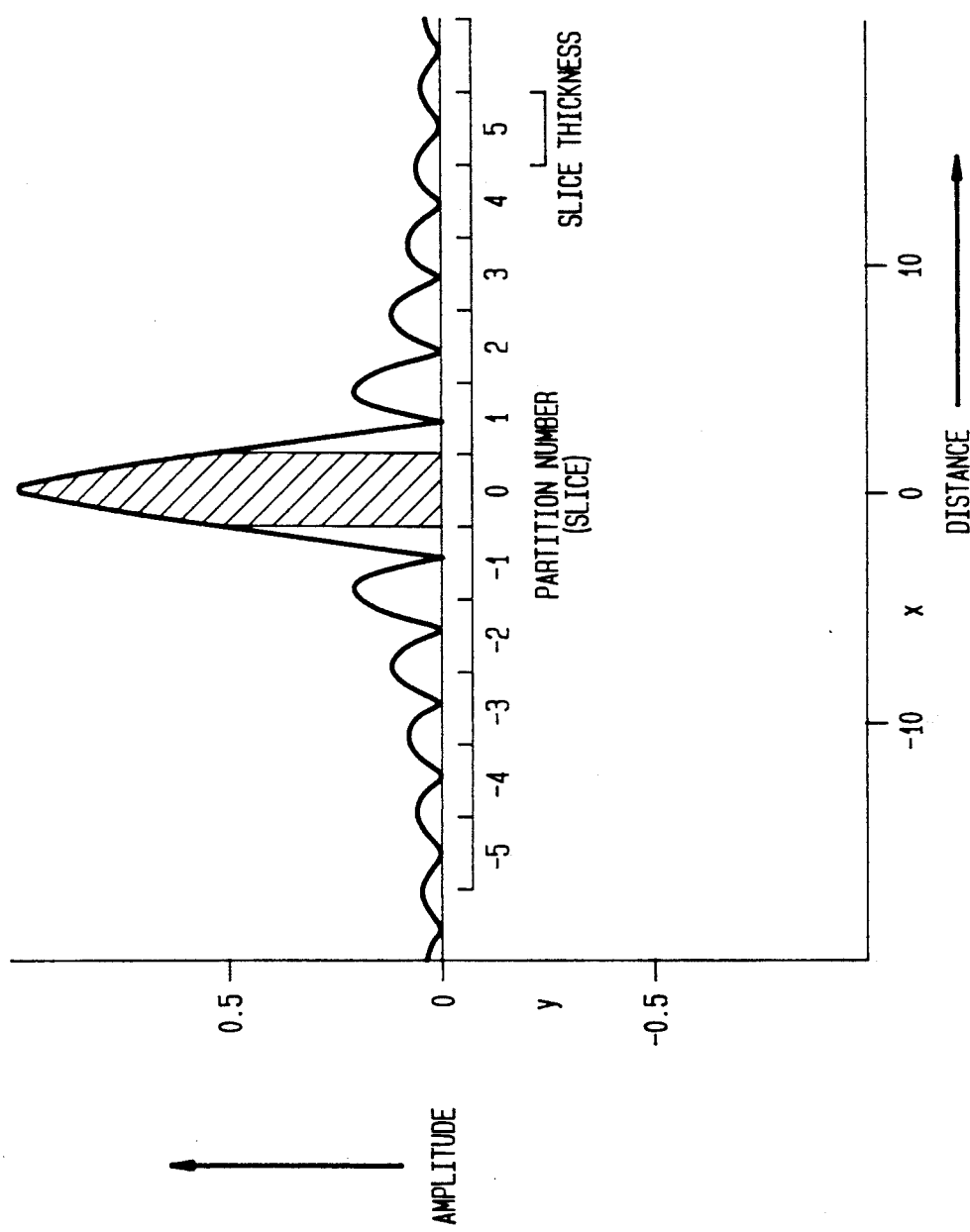
FIG. 1 illustrates the relative contribution of the signals from various points in space (orthogonal to the image plane), to the image of slice ("partition") zero.
Figure 2:
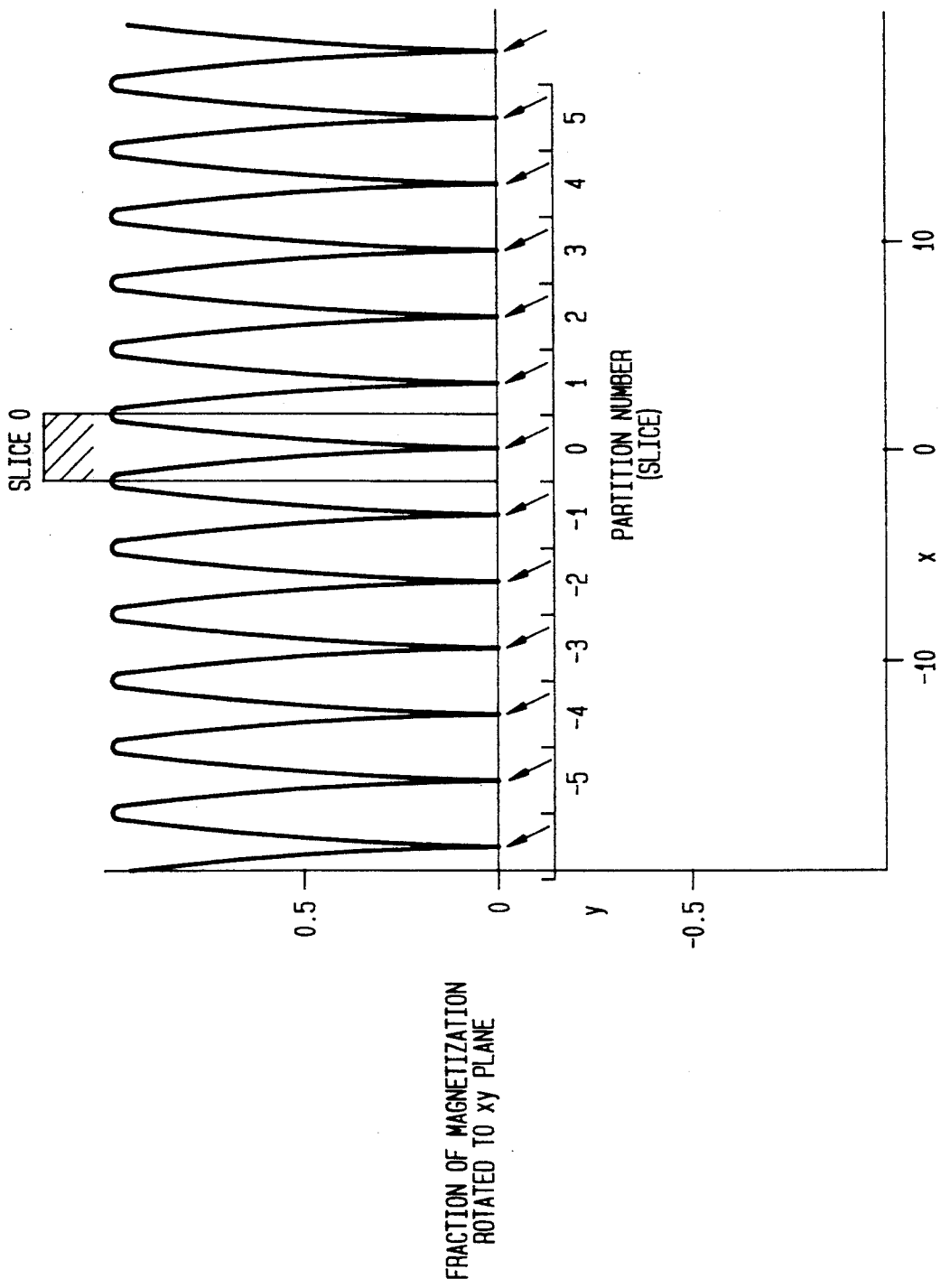
FIG. 2 illustrates the fraction of magnetization rotated to the xy plane in a sample having applied thereto a saturation pulse in accordance with the present invention.

FIG. 1 shows the relative contribution of the signals from various points in space (orthogonal to the image plane), to the image of slice ("partition") zero. Signal from only the shaded area is desired. The remaining areas represent contributions to the image of slice zero which arise from outside the nominal boundaries of the selected slice.

The radiofrequency pre-pulse (typically, a "1—1" pulse) leaves the sample magnetization unaltered in the center of each partition, but nutates it to the x,y plane at the slice edges. This pulse is applied simultaneously with a linear field gradient in the slice selection direction. The magnetization in the x,y plane is allowed to dephase (optionally with the use of a field gradient) and is thus not available for the ordinary 3-D imaging sequence which follows. The magnetization which remains along the z axis (arrows) is available, and gives rise the image signal. This non-availability of the Z magnetization (which produces the signal) is termed "saturation".

Note: Alternatively, this effect shown in FIG. 3 may be stretched horizontally slightly to eliminate the signal in the high-numbered slices (+ or −). This may be used to minimize the 'folding' of information from one side of the stack to the other. This can replace the selective RF excitation ('slab selection') which is normally used for this purpose, allowing shorter echo times.

Figure 3:
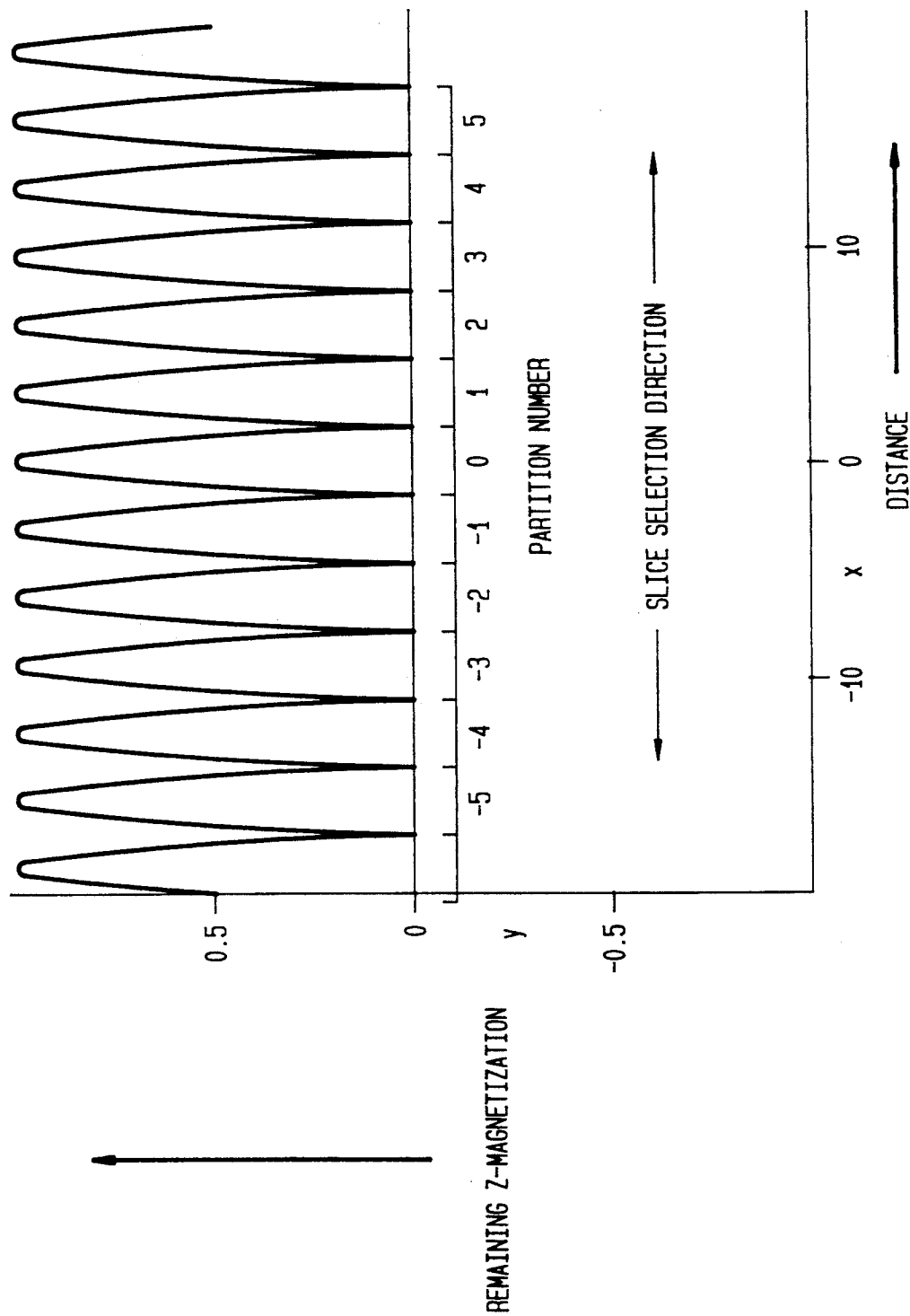
FIG. 3 illustrates the remaining Z magnetization left to form the image.

As shown in FIG. 3, After the 'saturation pulse', only this Z magnetization remains to form the images. Now, a normal 3-D imaging sequence (such as that well known in the art, for example that described in the Users Manual of the Siemens Magnetom SP, available from Siemens Medical Systems, Iselin, N.J., and incorporated herein by reference) is used. The slice profile of Drawing 1 is modulated (multiplied) by this function.

Figure 4:
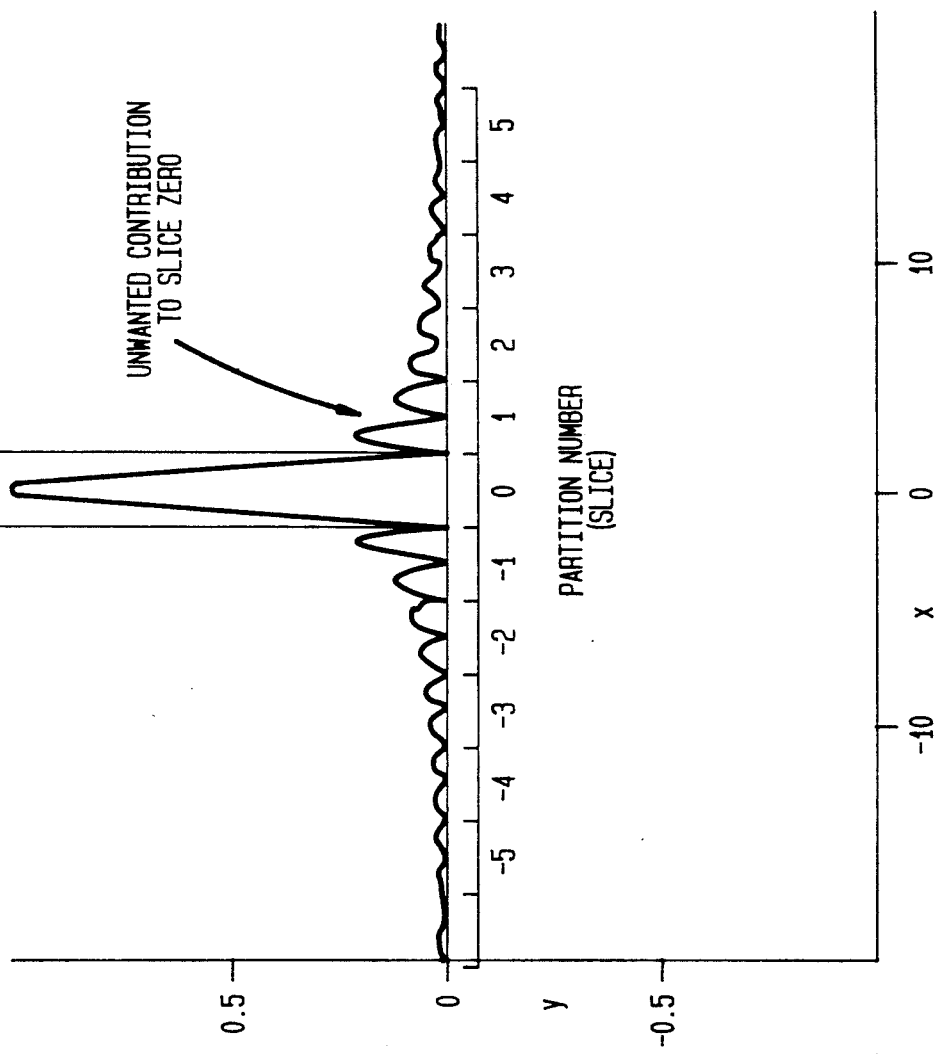
FIG. 4 illustrates the effect of the nulling caused by imposition of the FIG. 2 magnetization on the 3-D slice profile of FIG. 1.

FIG. 4 shows the effect of the signal nulling produced by the imposition of (multiplication of) saturating pulse upon the 3-D slice profile of FIG. 1. The central spike is contained entirely in the correct partition, and the unwanted signal falls off more rapidly with distance than in FIG. 1.

What I claim is:

1. A method for removing unwanted signal components acquired by applying a three dimensional magnetic resonance imaging pulse sequence to a sample, wherein signal acquisition is desired from a selected planar slice, but unwanted signal components are also acquired from a plurality of planar slices located outside the boundaries of said selected slice, said method comprising the following steps in the named order: p1 applying both a radio frequency saturation pre-pulse and a linear field gradient to said sample, which pre-pulse and field gradient create a comb-like pattern of planar nuclear magnetic saturation regions in said sample each of said regions being spatially positioned between a respective pair of contiguous planar slices; and applying a 3-D imaging sequence to said sample, the timing of said application of the 3-D imaging sequence being such that the comb-like saturation pattern of said pre-pulse sequence is imposed upon said 3-D imaging sequence so as to reduce the acquisition of signal originating from said regions when acquiring signal from said selected slice.

2. A method according to claim 1, in which said comb-like saturation pattern generated by said pre-pulse and gradient, is applied so as to leave the nuclear magnetization of said sample unaltered in the center of each of said slices.

3. A method according to claim 2, in which the step of applying the 3-D imaging sequence includes the step of collecting image data from each of the slices in said sample, with the image data from each said region in said sample being greatly reduced due to the effect of said comb-like saturation pattern.

4. A method according to claim 1, in which the spacing between the teeth of said comb-like saturation pattern symetrically increases for teeth more remote from the center of said sample, so that when it is applied the nuclear magnetization of slices in the center of the sample is unaltered, but the nuclear magnetization of slices near the edges of the sample is saturated.

5. A method according to claim 1, in which the radio frequency pre-pulse includes two non-selective radio frequency pulses which are substantially equal in magnitude.

* * * * *